United States Patent [19]

Ferralli

[11] Patent Number: 4,836,328

[45] Date of Patent: Jun. 6, 1989

[54] OMNIDIRECTIONAL ACOUSTIC TRANSDUCER

[76] Inventor: Michael W. Ferralli, 10580 East Lake Rd., North East, Pa. 16428

[21] Appl. No.: 42,981

[22] Filed: Apr. 27, 1987

[51] Int. Cl.[4] .............................................. H05K 5/00

[52] U.S. Cl. .................................... 181/155; 181/156; 181/175; 181/176; 181/199; 381/160

[58] Field of Search ............... 181/155, 175, 156, 176, 181/199; 381/155, 160

[56] References Cited

U.S. PATENT DOCUMENTS

| | | | |
|---|---|---|---|
| 1,732,722 | 10/1929 | Horn | 181/175 X |
| 2,064,911 | 12/1936 | Hayes | 181/175 X |
| 3,007,133 | 10/1961 | Padberg, Jr. | 181/175 X |
| 4,421,200 | 12/1983 | Ferralli et al. | 181/175 X |
| 4,474,258 | 10/1984 | Westlund | 181/155 X |
| 4,588,042 | 5/1986 | Palet et al. | 181/155 X |
| 4,629,030 | 12/1986 | Ferralli | 181/175 X |

*Primary Examiner*—B. R. Fuller

[57] ABSTRACT

An enclosure for a transduction element incorporates a geometrically shaped acoustically reflective shell. This acoustically reflective shell is shaped so that the inner surface thereof is at a least a section of that shape generated when a parabolic structure is rotated around a line which, lies in the plane of the parabolic structure, is perpendicular to the major axis of the parabolic structure. Such geomtrically generated shapes will have one distinct focal curve. A transduction element placed about this focal curve will, in operation, cause acoustic radiation to be produced which will be characterized by a plane wavefront of coherent radiation. Said device may alternately act as a transducer which produces a 360 degree beam width by placement of a plane wavefront producing transduction means at a position above the acoustically reflective shell and parallel to the plane of the distinct focal curve. Finally, by appropriate selection of transduction element and reflective shell composition, the device may operate as a transmitter or receiver of electromagnetic radiation.

9 Claims, 5 Drawing Sheets

OMNIDIRECTIONAL ACOUSTIC TRANSDUCER

FIELD OF INVENTION

This invention relates to acoustic transducers and specifically to an improved omnidirectional acoustic transduction system.

DISCUSSION OF PRIOR ART

Heretofore a significant limitation of the current state of the art acoustic transducers has been their frequency dependent beamwidth. The beamwidth of compression drivers as well as more conventional transducers is a function of both the size of the vibrating element (the transducer size in the case of conventional transducers and the exit dimension in the case of compression drivers) and the frequency of vibration. Compression drivers make use of an acoustic impedance matching device in the shape of a horn attached to the exit of the driver to partially control beamwidth as well as improve efficiency. This solution greatly improves efficiency but only partially resolves the beamwidth frequency dependence. Other compression drivers attempt to reduce this frequency dependence by resorting to very small compression driver exits, but this solution reduces transducer efficiency.

Recently, a transducer system appeared in the state of the art which controls beamwidth dependence by use of an enclosure which is shaped as the envelope of ellipsoids having radially oriented distinct focal points as well as a common focal point. Transducers placed at the distinct focal points will have their acoustic radiation focused at the common focal point and, provided that the ellipsoids have essentially identical parthlengths from distinct focal point to ellipsoid to common focal point their acoustic energy will be coupled in phase. Further, the beamwidth of this device is wide and essentially frequency independent. The device, however, displays a radial interference pattern when the acoustic radiation of the transducers located on the radially distributed distinct focal points interacts. Specifically transducers on neighboring distinct focal points can destructively interfere with eac other causing radial diffraction or combing in the acoustic radiation field.

Another transducer system which has appeared in the state of the art overcomes the radial interference problem by use of an acoustic reflective lens whose shape is produced when a section of an ellipse is revolved about a line which passes through one of the focal points of the ellipse at some finite angle with respect to the ellipse major axis. In one embodiment, the lens is shaped like that of a cone, the sides of which are concave and describe a continuum of sections of identical ellipses. One focal point, common to all the ellipses, is positioned directly above the apex of the cone while the other focal points of the ellipses describe a circle around the base of the cone. A transducer placed at the common focal point, facing the apex, will have its radiation reflected from the cone surface and, owing to the elliptical shape of the sides of the cone, focused coherently onto the focal circle referred to above. The focal circle will appear as a virtual source of coherent acoustical radiation which, due to the symmetry of the cone, will emanate equally from the base of the cone. The beam width of acoustical radiation perpendicular to the base of the cone is controlled by the elliptical shape of the sides of the cone. Two such cones, with accompanying transducers, may be placed base-to-base in order to produce a radiation pattern whose horizontal beamwidth is 360 degrees and whose vertical beam width is frequency invariant.

A limitation of this reflective lens exists that is due to the use of the elliptical geometry. This geometry constrains radiation to emanate, or appear to emanante, from the common focal point of the acoustic lens in order to be coherently focused onto the focal circle. Currently available transducers do not produce such radiation and thus the radiation pattern from this acoustically reflective lens will be somewhat incoherent and may exhibit interference due to this constraint.

OBJECTS

Accordingly, an object of this invention is to provide a geometrically shaped reflective lens for a transduction element such that all acoustic pathlengths from the transduction element surface to the lens focal element are substantially identical. Another object of this invention is to provide a geometrically shaped reflective lens which will focus acoustic waves produced by the transduction element to a focal element which is characteristic of the lens. Another object of the invention is to increase the beamwidth of the acoustic radiation emanting from the lens and provide for the relative consistency of the beamwidth as a function of acoustic wave frequency.

It is another object of the invention to provide a single transduction element or a nonradially interfering array of transducers which will appear to act as a single source with wide and essentially frequency invariant beamwidth.

It is another object of the invention to create a field of focused acoustic radiation whose beam shape is controlled by a geometrically shaped lens. It is another object of this invention to create an acoustic transduction system which will display a nonradially interfering acoustic field.

It is another object of this invention to produce a transduction system which can be used to transduce acoustic energy into electrical energy with both stereophonic and monophonic compatibility.

It is another object of this invention to transduce electromagnetic energy into electrical energy.

It is another object of this invention to create an essentially plane wave of acoustical or electromagnetic energy from radiation emanating from a circular transduction element.

DRAWINGS

FIG. 1 is a full section as viewed from the side of one embodiment of the invention utilizing a shell whose shape is that generated when a parabola is rotated around a line which lies in the plane of the parabola, is oriented parallel to the major axis of said parabola, and contains a transduction element which is oriented perpendicularly to the aforesaid line such that radiation emitted therefrom is concentrated upon the focal circle of said shape.

DESCRIPTION

Figure 1:
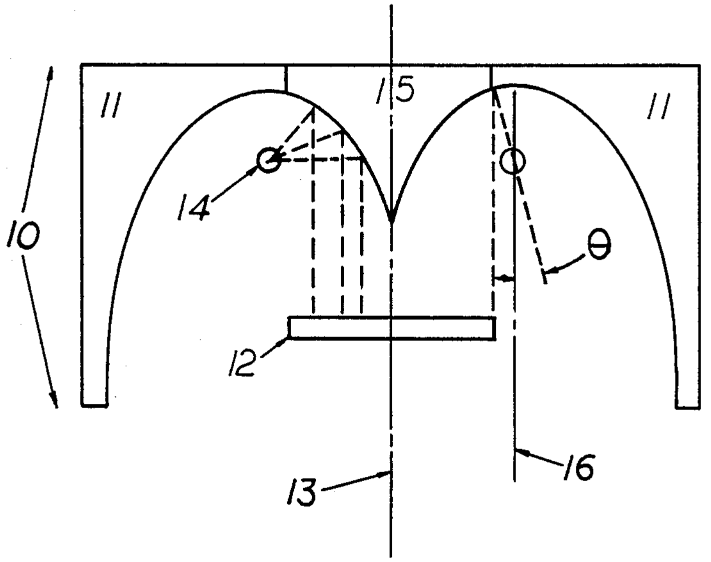
Figure 2:
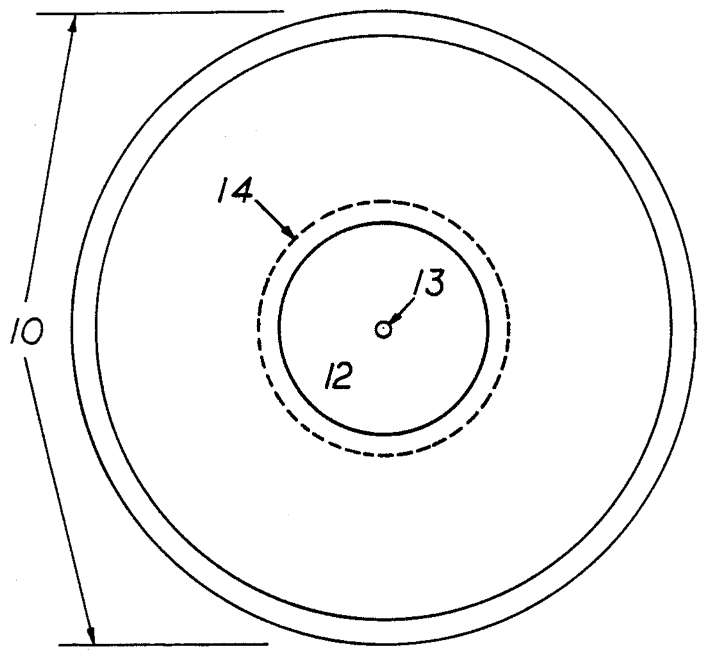
FIG. 2 is a front view thereof.

FIGS. 1 and 2 of the drawings illustrate the side and front views of a transducer designed to radiate acoustic energy from a transduction element placed therein. The transducer 10 incorporates a geometrically shaped shell, which consists of sections 11 and 15, and a transduction element 12, which is shaped so as to produce at least an approximation to a section of a plane wave, and which is located so as to be perpendicular and centered about the line 13, the axis of rotation of the shell section 11 and 15. The shape of shell sections 11 and 15 are generated when a parabola is rotated about line 13 which lies in the plane of the parabola and is parallel to the parabola's major axis line 16. The focal point of said parabola, when rotated about line 13, generate a focal circle 14. The shell sections, 11 and 15, and the transduction element 12 are oriented with respect to one another so that a plane wave generated by the element 12 will, upon striking and being reflected by shell sections 11 and 15, be focused and concentrated upon focal circle 14. Suitable materials for the shell sections 11 and 15 include wood, metal, reinforced resin, or other structural material. The transduction element 12 may be made of plastic, metal, resin impregnated cloth, or other suitable material. The dimensions of the device may vary in order to suit the desired end use, but it is to be understood in all cases that for most efficient operation the dimensions of the transducer should be larger than the longest wavelength of acoustic radiation produced by the transducer.

Figure 3:
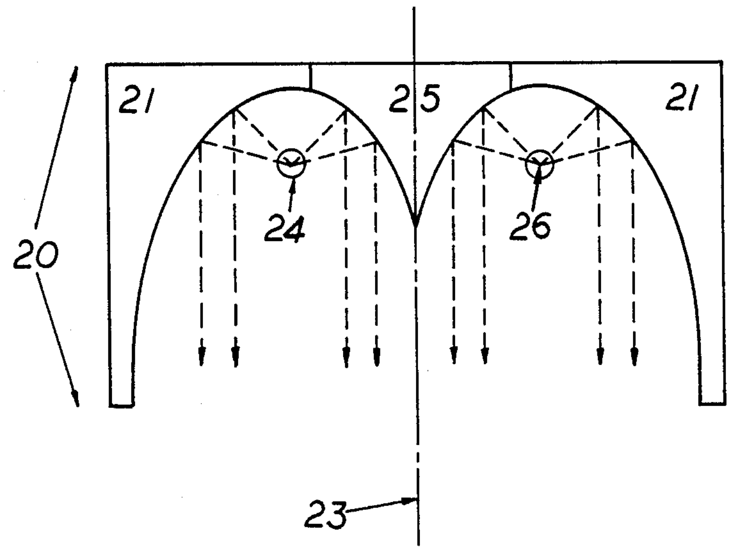
FIG. 3 is a full section as viewed from the side of an embodiment of the invention wherein the transduction element is placed at the focal circle of a shell whose shape is that generated when a parabola is rotated as above described.

FIG. 3 of the drawings illustrate a view of another transducer designed to radiate acoustic energy from a transduction element placed therein. The transducer 20 incorporates a geometrically shaped shell consisting of sections 21 and 25 and incorporates a transduction element 24 shaped as a torus centered about a circular line containing the focal circle 26, of the shell sections 21 and 25. The shell sections 21 and 25 are shaped substantially in the same manner as shell sections 11 and 15 and contains a similar axis of rotation, line 23. Suitable material for the shell sections 21 and 25 include wood, metal, reinforced resin, or other structural material with reasonable acoustic reflection characteristics. The transduction element 24 may be made of plastic, metal, resin impregnated cloth, or other suitable material or may be a piezoelectric material.

Figure 4:
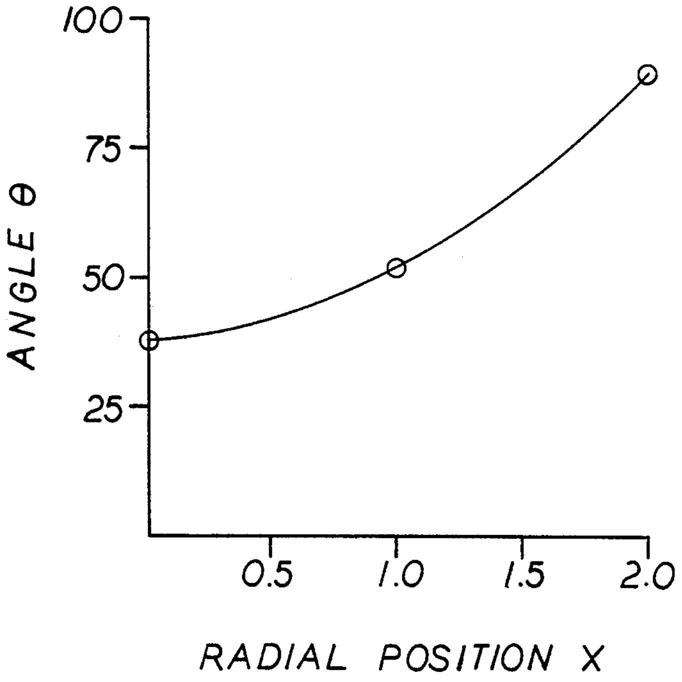
FIG. 4 is a plot of the functional relationship between the radial position of a point on the transduction element of the invention generating acoustic radiation measured from the axis of rotation of the shell, and $\theta$, the corresponding angle of acoustic radiation emitted from the focal circle characteristic of the shell.

FIG. 4 of the drawing shows the relationship between the radial position of radiation emitted from a transduction element contained within the transducer of the invention and the corresponding angle $\theta$ of acoustic radiation emitted from the focal circle of the invention, said angle measured with respect to the major axis of the parabola as indicated in FIG. 1.

Figure 5:
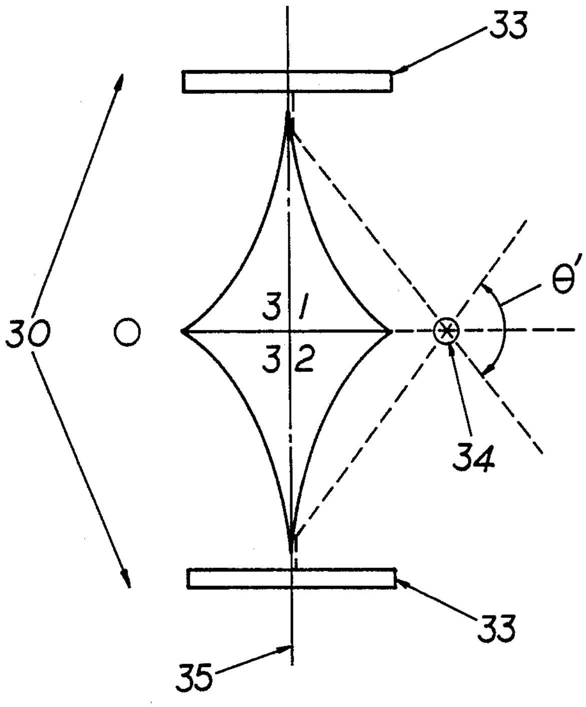
FIG. 5 is full section as viewed from the side of an embodiment of the invention using sections of two shells, each formed as illustrated in FIG. 1, wherein said sections are placed in mirror image of one another and share a common focal circle.

FIG. 5 of the drawings shows another embodiment of the invention designed to create a uniformly distributed acoustic radiation field from two transducers placed therein. The transducer 30 incorporates shell sections 31 and 32, each of which are produced when that section of a parabola bounded by the point of intersection of a line drawn through the focal point perpendicular to the major axis of the parabola and the point of intersection of line 35, is rotated about the line 35 which lies in the plane of the parabola and is parallel to the major axis of the parabola. The sections 31 and 32 thus generated will have a focal circle 34, which is made common to both when the sections are placed so as to be in mirror image of each other. Transduction elements 33 are placed so as to be centered about and perpendicular to line 35, the axis of rotation of the transducer. Materials suitable for the shell sections and transduction elements are similar to those described for the previous embodiments.

OPERATION

In the operation of the transducer 10, acoustic radiation from the transduction element 12 is directed substantially toward the interior of the acoustically reflective shell sections 11 and 15. The transduction element 12 converts an electrical signal to an acoustical signal by any methods known in the state of the art such as by electromagnetic or piezoelectric means. The transduction element 12 is at least approximately centered about the line 13, and the acoustic signal produced by it appears to at least approximate a section of a plane wave. The acoustic signal produced by the transduction element 12 will thus be reflected from shell section 15 and concentrated and focused in the region of the focal circle 14. Since all radiation produced from any point on transduction element 12 is of the same phase, and since all radiation from the transduction element 12 travels the same pathlength to the focal circle 14, all radiation arriving at the focal circle 14 will be in phase. The dotted lines in FIG. 1 indicate possible paths from the transducer element 12 to the focal circle 14. The dashed line indicates a path taken from the transducer element 12 to the focal circle and then emanated from the focal circle 14 at an angle $\theta$, measured with respect to the major axis of the parabola, line 16. Acoustic radiation emanating from the region of the focal circle 14 would strike shell section 11 and be emitted from the transducer 10 as a phase coherent plane wave. Optionally, the shell section 11 could be deleted and thereby cause radiation emitted from the focal circle 14 to be radially dispersed about the transducer 10. The radiation pattern would be radially symmetric about line 13. The shell section 15, being parabolically shaped as hereinbefore described will cause all acoustic radiation from the transduction element 12 to travel the same distance in reaching the focal circle 14 and thus all acoustic radiation arriving at focal circle 14 will arrive in phase so long as all points on the transduction element 12 produce phase matched acoustic radiation. Under the above conditions, focal circle 14 will appear to be the source of acoustic radiation rather than the actual transduction element 12 itself. Further, acoustic radiation emanating from focal circle 14 will be in phase and have intensity and phase consistency above that produced by any other arrangement of transduction element not involving a shell shaped such as shell sections 11 and 15. The angle $\theta$ of the acoustic radiation from focal circle 14 measured with respect to the major axis of the parabola, line 16, is related to the radial position of acoustic radiation emanating from the transduction element 12 by the equation $$\theta = \tan^{-1}[4A(R-x)/(4A^2-(R-x)^2)]$$

where R is the perpendicular distance between line 13 and line 16. A is the length of the latus rectum of the parabola, and x is the radial distance from line 13 to a radiating point of transduction element 12. Thus the angle $\theta$ is related to radial position of acoustic radiation from transduction element 12 as shown in FIG. 4. Assuming that the acoustic radiation intensity decreases as a function of radial position on the transduction element, the vertical beamwidth (the angular width of the radiation pattern in the plane containing line 13) of the acoustic radiation emanating from the common focal circle 14, can be made largely insensitive to changes in the beamwidth since it is dependent on the radial constancy of the acoustic radiation emanating from the transduction element 12. This vertical beamwidth is the angular width of the acoustic radiation pattern which is emitted from the focal circle 14 in the plane containing the line 13. Due to the symmetry of the shell section 11 about the line 13, and the centering of the transduction element about this line, the horizontal beamwidth (the angular width of the radiation pattern in the plane perpendicular to line 13) will be 360 degrees wide. Thus, the beam width of the radiation emanating from the focal circle will be insensitive to the beam width of the acoustic radiation emanating from the transduction element 12. It is well known that the beamwidth of acoustic radiation emanating from transduction elements tends to decrease with increasing frequency of the radiation, but because of the angular redistribution of acoustic energy by the parabolic shape of the shell section 15, and the placement of the shell in the region of production of plane waves by the transduction element, the frequency dependence of the beamwidth emanating from focal circle 14 will be minimal. The embodiment of the invention illustrated in FIGS. 1 and 2 can thus act to produce an acoustic radiation pattern whose beamwidth is essentially frequency independent and potentially much larger than corresponding beamwidth of other transducers. Since all acoustic radiation emanating from the transduction element 12 arrives at the common focal point in phase, minimal phase differences in the radiation pattern of the transducer will be noted and the radiation pattern will be greatly improved when compared to other transducers. The beam width of the acoustic radiation emanating from the focal circle 14 can be made larger or smaller than the beamwidth of the acoustic radiation emanating from the transduction element 12 by suitable choice of the length of the latus rectum of of the parabola used to generate the shell section 15. The optional addition of shell section 11 allows the radiation emanating from the focal circle 14 to be reformed into a plane wave if desired.

The embodiment of the invention illustrated in FIG. 3 illustrates a transducer 20, which contains shell sections 21 and 25, and transduction element 24, which contains focal circle 26, operates in a manner similar to that illustrated in FIGS. 1 and 2 except that the transduction element 24 is placed at the location of the focal circle 26 and is shaped substantially as a torus. Acoustic radiation produced by a thus shaped transduction element 24 will, upon reflection from the shell sections 21 and 25, be emitted from the transducer as a plane wave. Unique to this embodiment of the invention is the focal circle which allows a much larger surfacce area transduction element 24 to be utilized than could be utilized with a conventional parabolic reflector. A conventional parabolic reflector contains only a focal point and allows very limited space for a transduction element. Thus this embodiment of the invention can produce a much more intense plane wave than a conventional parabolic reflector. Conversely, this embodiment of the invention can receive much less intense waves than a conventional parabolic reflector.

The embodiment of the invention illustrated in FIG. 5 comprises two shell sections 31 and 32 and two transduction elements, each labeled 33, which are oriented in mirror image of one another. Each mirror image section operates in a manner similar to that illustrated in FIG. 1. Plane wave radiation produced by transduction elements 33 will strike the shell sections 31 and 32, which due to their shape as described above, will reflect the radiation and cause it to be focused and concentrated upon the focal circle 34. The transduction elements are each oriented the same distance from their respective shell sections and are operated in phase and thus all radiation arriving at the focal circle will be in phase. The vertical beam width $\theta'$ of the radiation emanating from the focal circle 34 will thus be in phase, and due to the symmetry of the transducer and the symmetric placement of the components thereof, the horizontal beamwidth will be a full 360 degrees. Of course the horizontal beamwidth can be easily controlled by use of only a radial section of the transducer 30. In this case the horizontal beamwidth would be controlled by the angular section utilized.

It is to be understood that, although the discussion of the operation of the above described embodiments of the invention has considered the transduction element to be a radiator of acoustic energy, the invention would obviously operate equally well as a receiver of such energy. When operating as a receiving transducer, the invention would function as a fixed beamwidth directional microphone. It is also to be understood that, although the transduction elements illustrated in the above embodiments of the invention are shown as a continuous elements, they could be a segmented series of elements which could be operated in phase with one another to generate acoustical energy or with differences in phase and/or intensity to cause a desired effect in the resultant beam from the common focal point. It is also to be understood that some segments of the segmented disphragm may act as receivers of acoustic energy while others may act as transmitters.

It is also to be understood that precise location of each of the components of the invention is not necessary for its operation due to the relatively long wavelengths associated with acoustic radiation. Tolerances in construction of the invention including the location of all elements thereof should not, in general, exceed $\frac{1}{4}$ of the wavelength of the highest frequency of acoustic radiation for which the invention is to be used. It is also to be understood that the invention would operate equally well as a transducer of electromagnetic radiation so long as the electromagnetic radiation wavelength is not smaller that the tolerances to which the invention could be constructed.

While the above description contains many specificities, these should not be construed as limitations on the scope of the invention, but rather as an exemplification of a number of preferred embodiments thereof. Accordingly, the scope of this invention should be determined not by the embodiments illustrated, but by the appended claims and their legal equivalents.

What is claimed is:

1. A transducer which comprises, in combination, an acoustic transducing means for generating acoustic radiation and an acoustically reflective shell wherein said shell comprises at least a section that forms a parabolic structure having a focus and vertex, that generates a continuum of parabolas when rotated about a straight line, defined as an axis of rotation, which is parallel to and distinct from a separate straight line which passes through both the focus and the vertex of said parabolic structure, said separate straight line being defined as a major axis of the parabolic structure, and such that one resultant surface of said acoustically reflective shell is that of at least a section of a surface formed by the continuum of said parabolas radially distributed about said axis of rotation, said axis of rotation being parallel to the said major axis of said parabolic structure, and such that focal points of the continuum of said parabolas, being distinct from one another, form a curve, said curve being referred to as a distinct focal curve, and such that the said major axis of the parabolic structure, being rotated about the said axis of rotation forms a continuum of major axes, and wherein said acoustic transducing means is located about the said distinct focal curve so that the acoustic radiation produced therefrom travels from any point on said transducer to the acoustically reflective shell and thence forms an acoustic wave charcterized by a wavefront which constitutes a plane surface, referred to as a plane wavefront, and such that all acoustical radiation emanating from any point on said transducer, being in phase, produces acoustic radiation characterized by a plane wavefront.

2. A transducer according to claim 1 wherein the acoustic transducing means, being a receiver rather than a producer of acoustic radiation, is located about the distinct focal curve such that any acoustic radiation which is characterized by a plane wavefront and which travels in a direction perpendicular to the said axis of rotation of the acoustically reflective shell toward said shell is reflected from said shell and thence concentrated and focused upon said distinct focal curve and said acoustic transducing means.

3. A transducer according to claim 1 wherein the acoustic transducing means is an acoustic radiation generator.

4. A transducer according to claim 1 wherein the acoustically reflective shell is reflective of electromagnetic radiation and wherein the acoustic transducing means is an electromagnetic rather than acoustic transducing means.

5. A transducer according to claim 1 wherein the transducing means consists of a number of segments, which may be separate transducing elements, and which may independently transduce acoustic energy.

6. A transducer according to claim 1 wherein the transducing means consists of a number of segments, which may be separate transducing elements, and which may indepedently transduce electromagnetic energy and wherein the acoustically reflective shell is reflective of electromagnetic radiation.

7. A transducer according to claim 1 wherein the acoustic transducing means may be placed at a position above the acoustically reflective shell and perpendicular to the major axes of the continuum of parabolas and the axis of rotation, such that acoustic radiation produced therefrom travels the same pathlength from said acoustic transducing means to the acoustically reflective shell and thence to the distinct focal curve.

8. A transducer according to claim 2 wherein the transducing means is a microphone.

9. A transducer according to claim 2 wherein the transducing means is a transducing means for electromagnetic energy and said acoustically reflective shell is reflective of electromagnetic energy.

* * * * *